(12) United States Patent
Lai et al.

(10) Patent No.: US 6,416,615 B1
(45) Date of Patent: Jul. 9, 2002

(54) DEVICE FOR DETECTING ABNORMALITY IN CHEMICAL-MECHANICAL POLISHING OPERATION

(75) Inventors: Chien-Hsin Lai, Kaohsiung Hsien; Hui-Shen Shih, Changhua Hsien; Jung-Nan Tseng, Hsinchu Hsien; Huang-Yi Lin, Taichung Hsien, all of (TW)

(73) Assignee: United Microelectronics Corp., Hsinchu (TW)

(*) Notice: Subject to any disclaimer, the term of this patent is extended or adjusted under 35 U.S.C. 154(b) by 118 days.

(21) Appl. No.: 09/660,863

(22) Filed: Sep. 13, 2000

(30) Foreign Application Priority Data

Aug. 31, 2000 (TW) ........................................ 89117742 A

(51) Int. Cl.$^7$ ........................... C23F 1/02; H01L 21/302
(52) U.S. Cl. ........................... 156/345 LC; 156/345 LP
(58) Field of Search ............................... 216/88, 89, 84, 216/86; 438/692, 693, 14, 17, 18; 156/345 LP, 345 LC

(56) References Cited

U.S. PATENT DOCUMENTS

| | | | |
|---|---|---|---|
| 5,491,113 A | * 2/1996 | Murota | 437/225 |
| 5,722,876 A | * 3/1998 | Mori | 451/10 |
| 5,846,882 A | * 12/1998 | Birang | 438/692 |
| 5,948,700 A | * 9/1999 | Zheng et al. | 438/694 |

FOREIGN PATENT DOCUMENTS

| | | | |
|---|---|---|---|
| JP | 62-160092 | * | 7/1987 |
| JP | 01-023793 | * | 1/1989 |
| JP | 06-252112 | * | 9/1994 |

* cited by examiner

Primary Examiner—George Goudreau
(74) Attorney, Agent, or Firm—Charles C. H. Wu; Wu & Cheung, LLP

(57) ABSTRACT

A detecting device for monitoring any abnormality in chemical-mechanical polishing. The detecting device includes a motor, an inverter, a control circuit, a rotation sensor, a current sensor, a relay controller and a chemical-mechanical controller. The inverter converts a direct current into an alternating current for driving the motor. The control circuit controls size and functioning of the output alternating current from the inverter. The rotation sensor is a transducer for converting the running speed of the motor into a rotation signal and transmitting the signal to the control circuit. The current sensor monitors the size of the alternating current flowing to the motor and then outputs a current signal. The relay controller receives the current signal from the current sensor and outputs a drive signal. The chemical-mechanical polishing controller receives the drive signal from the relay controller and outputs a system halt signal to the control circuit. The detecting device of this invention is able to detect any serious scratching or chipping of a silicon chip during a chemical-mechanical polishing operation so that the amount of damaged chips is greatly reduced.

9 Claims, 4 Drawing Sheets

DEVICE FOR DETECTING ABNORMALITY IN CHEMICAL-MECHANICAL POLISHING OPERATION

CROSS-REFERENCE TO RELATED APPLICATION

This application claims the priority benefit of Taiwan application serial no. 89117742, filed Aug. 31, 2000.

BACKGROUND OF THE INVENTION

1. Field of Invention

The present invention relates to a detector for checking the condition of a silicon chip undergoing chemical-mechanical polishing. More particularly, the present invention relates to a detector capable of sensing any scratching or chipping of the silicon chip during chemical-mechanical polishing.

2. Description of Related Art

Chemical-mechanical polishing (CMP) is a global planarization technique in very-large scale integration (VLSI) or ultra-large scale integration (ULSI). The technique utilizes a grinding wheel, a chemical reagent or mixture of reagents for mechanically removing the top bumpy surface layer off a silicon chip.

FIG. 1 is a schematic cross-sectional view of the elements of a conventional chemical-mechanical polishing station necessary for carrying out a chip planarization. As shown in FIG. 1, the elements in the conventional chemical-mechanical polishing station include a polishing table 10 and a holder 16. The holder 16 is used to grasp the back surface of a silicon chip 14. To carry out chemical-mechanical polishing, the front surface of the silicon chip 14 is pressed against a polishing pad 12 on the upper surface of the polishing table 10.

During a CMP operation, both the polishing table 10 and the holder 16 will rotate at a pre-defined direction and a delivery tube will supply a chemical reagent to the polishing table 10 continuously. In other words, the CMP is a polishing process that utilizes chemical action of the chemical agent as well as the grinding action on the polishing table 10 to remove any protrusions on the upper surface of chip 14.

In the process of planarizing a silicon chip by CMP, some pollutants may drop on the polishing table resulting in severe scratching or chipping of the chip. A conventional polishing station has no monitoring system for detecting any serious scratching or chipping. Without any monitoring system for sounding an alarm or halting the polishing station, the offensive pollutants may remain undetected for quite some time. Since most processing operations are carried out in a continuous basis, by the time scratches or chipping of the chip are found, a large batch of silicon chips may have been produced. Hence, a large number of silicon chips has to be scrapped leading to great losses.

SUMMARY OF THE INVENTION

Accordingly, one object of the present invention is to provide a detecting device for finding any abnormality during a chemical-mechanical polishing operation so that any serious scratching or chipping of a silicon chip due to the presence of pollutant articles can be detected and removed in time to prevent a large batch of silicon chips all with defects are produced.

To achieve these and other advantages and in accordance with the purpose of the invention, as embodied and broadly described herein, the invention provides a detecting device for sensing any abnormality in chemical-mechanical polishing. The device includes a motor, an inverter, a control circuit, a sensor and a detector. The inverter converts a direct current into an alternating current for powering the motor. The control circuit controls size and functioning of the alternating output current from the inverter. The sensor is a transducer for converting the running speed of the motor into a rotation signal and transmitting the signal to the control circuit. The detector monitors the size of alternating current flowing from inverter to motor so that a system halt signal can be sent to the control circuit should any abnormality occur.

This invention also provides a second detecting device for finding any abnormality of a chemical-mechanical polishing operation. The detecting device includes a motor, an inverter, a control circuit, a rotation sensor, a current sensor, a relay controller and a chemical-mechanical controller. The inverter converts a direct current into an alternating current for driving the motor. The control circuit controls size and functioning of the output alternating current from the inverter. The rotation sensor is a transducer for converting the running speed of the motor into a rotation signal and transmitting the rotation signal to the control circuit. The current sensor monitors the size of the alternating current flowing to the motor and then outputs a current signal. The relay controller receives the current signal from the current sensor and outputs a drive signal. The chemical-mechanical polishing controller receives the drive signal from the relay controller and outputs a system halt signal to the control circuit.

The detecting device of this invention is able to detect any serious scratching or chipping of a silicon chip during chemical-mechanical polishing. This is possible because any extraordinary stress on the polishing station is indicated by the flow of an abnormal current in the electrical system. By sensing any abrupt variation of current in the electrical system, any pollutant particles that damage the silicon chip can be found and removed immediately.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
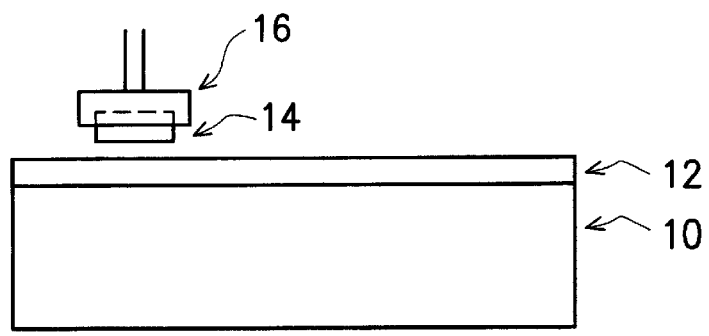
FIG. 1 is a schematic cross-sectional view of the elements of a conventional chemical-mechanical polishing station necessary for carrying out a chip planarization.

Reference will now be made in detail to the present preferred embodiments of the invention, examples of which are illustrated in the accompanying drawings. Wherever possible, the same reference numbers are used in the drawings and the description to refer to the same or like parts.

Figure 2:
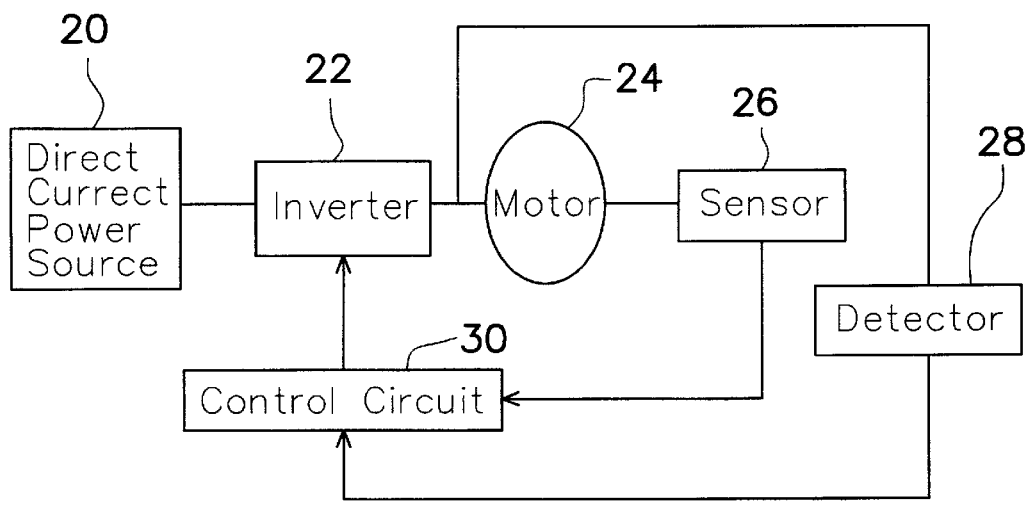
FIG. 2 is a block diagram showing the connections of various components for operating a chemical-mechanical polishing station according to this invention.

FIG. 2 is a block diagram showing the connections of various components for operating a chemical-mechanical polishing station according to this invention. The polishing station is driven by the torque of a motor 24. The motor 24 can be a three-phase alternating induction motor powered by an inverter 22. The inverter 22 is a device for converting a direct current from a direct current source 20 into a three-phase alternating current.

As shown in FIG. 2, a control circuit 30 controls size of alternating output current from the inverter 22 as well as the operation of the inverter 22. The control circuit 30 is able to receive signals from a sensor 26 and a detector 28 simultaneously. The output signal from the sensor 26 corresponds to the rotating speed of the motor 24. According to the output signal from the sensor 26, the control circuit 30 is able to control the output power from the inverter 22 such that the motor 24 can rotate at a constant speed. The output signal from the detector 28 corresponds to the working current of the motor 24. According to the output signal from the detector 28, the control circuit 30 is able to control the state of operation of the inverter 22 such that the motor 24 can be made to rotate or stop.

Figure 3:
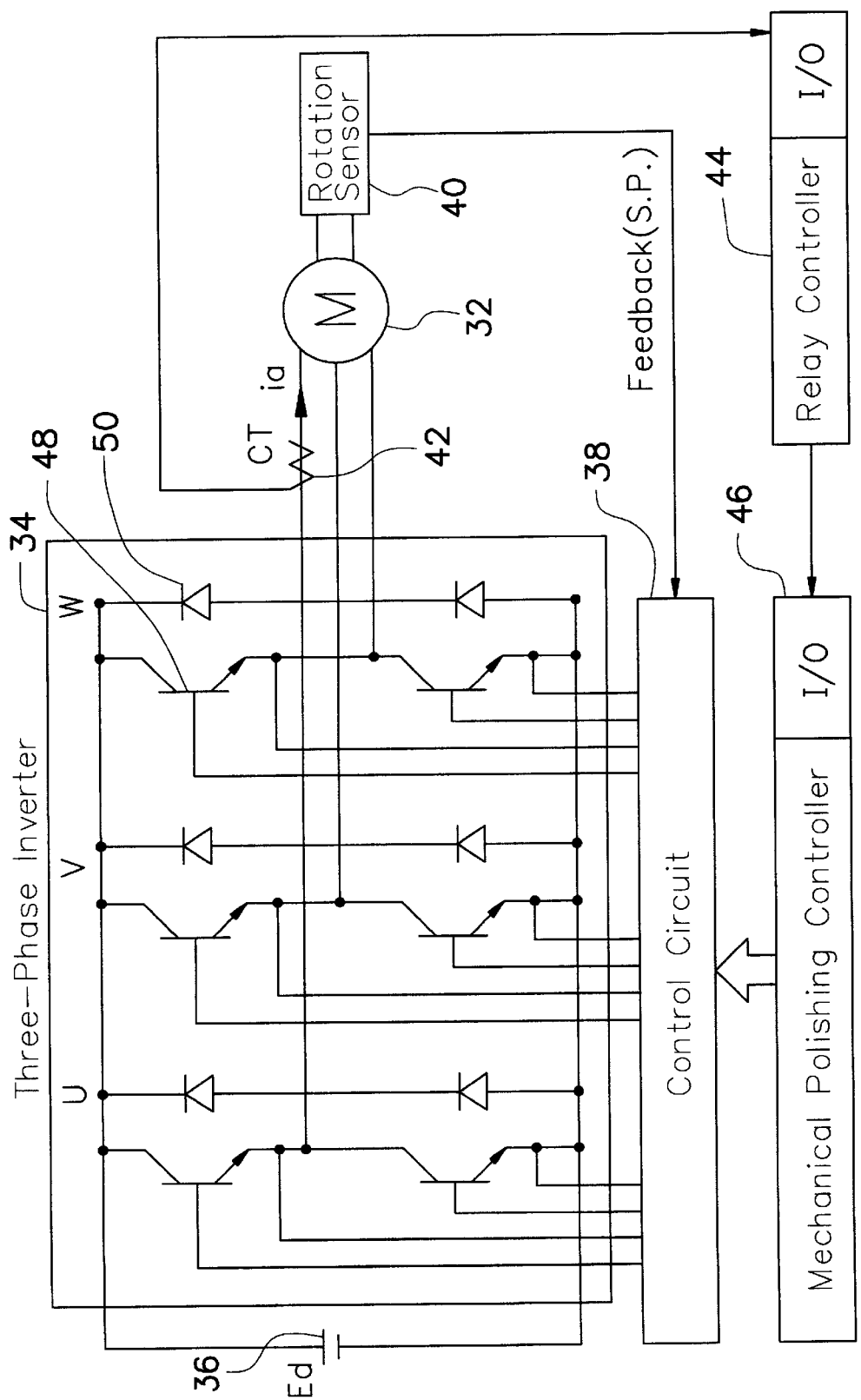
FIG. 3 is a circuit diagram showing the connections of various components and internal devices for operating a chemical-mechanical polishing station according to one preferred embodiment of this invention.

FIG. 3 is a circuit diagram showing the connections of various components and internal devices for operating a chemical-mechanical polishing station according to one preferred embodiment of this invention. In FIG. 3, a three-phase alternating current induction motor 32 is used as a motor for driving the polishing table of a polishing station. A three-phase inverter 34 converts the direct current form a power source Ed36 into a three-phase alternating current power source for the motor 32. The three-phase inverter 34 includes six transistors 48. Conduction of each transistor 48 is controlled by a control circuit 38. By connecting each transistor 48 in parallel with a diode 50, flywheel effect is produced.

In FIG. 3, a rotation sensor 40 detects the rotating speed of the three-phase alternating current induction motor 32 and sends a rotation signal to the control circuit 38. After receiving the rotation signal from the rotation sensor 40, the control circuit 38 controls the conduction period of the transistors 48 inside the three-phase inverter 34. Ultimately, the three-phase output current from the inverter 34 is able to drive the three-phase alternating current induction motor 32 at a constant speed.

A current transformer 42 is installed between the three-phase inverter 34 and the three-phase alternating current induction motor 32. The current transformer 42 measures the phase current $i_a$ from the inverter 34 to the motor 32 and then output a current signal to the input/output (I/O) terminal of the relay controller 44. According to size of the current signal, the relay controller 44 will compare with built-in current database. When the current signal shows some anomalous fluctuation due to the scratching or chipping of a silicon chip, the relay controller 44 will send out an I/O drive signal to the I/O terminal of a mechanical polishing controller 46. On receiving the receiving the I/O drive signal from the relay controller 44, the mechanical polishing controller 46 will issue a system halt signal to the control circuit 38. After receiving the system halt signal from the mechanical polishing controller 46, the control circuit 38 will inform the three-phase inverter 34 to switch off the three-phase alternating current so that the motor 32 stop rotating. In addition, an alarm will also be triggered somewhere near the polishing table to warn operating personnel to reset the polishing table.

Torque of the three-phase alternating current induction motor 32 is given by the formula $T=P \times \Phi_a \times i_a$. In the formula, P is the number of poles in the three-phase alternating current induction motor 32, $\Phi_a$ is the magnetic flux of the magnetic pole inside the three-phase alternating current induction motor 32 and $i_a$ is the phase current of the three-phase alternating current induction motor 32. The motor 32 has a fix number of magnetic poles. Since magnitude of magnetic flux in the magnetic poles of the motor 32 depends on the temperature and the degree of saturation of the permanent magnet, there will be very little magnetic flux variation inside the motor 32. Consequently, torque of the three-phase alternating current induction motor 32 is related to the phase current. In other words, torque produced by the motor 32 is directly proportional to the phase current.

As the three-phase alternating current induction motor 32 rotates at a constant speed, the motor 32 will experience torque fluctuation whenever the silicon chip on the polishing table is scratched or a piece of chip is broken off. Such torque fluctuation will lead to a variation of the phase current flowing to the three-phase alternating current induction motor 32. The variation in phase current is converted by the current transformer 42 into an electrical signal.

Figure 4A:
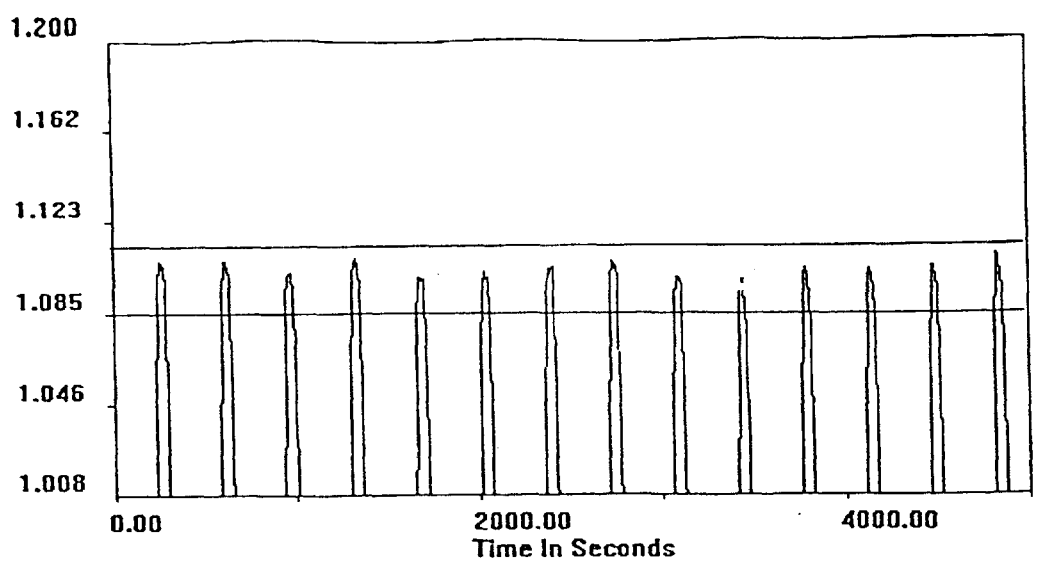
FIGS. 4A, 4B and 4C are graphs showing the waveforms of the phase current of a three-phase alternating induction motor measured by a current transformer under various polishing conditions.
Figure 4B:
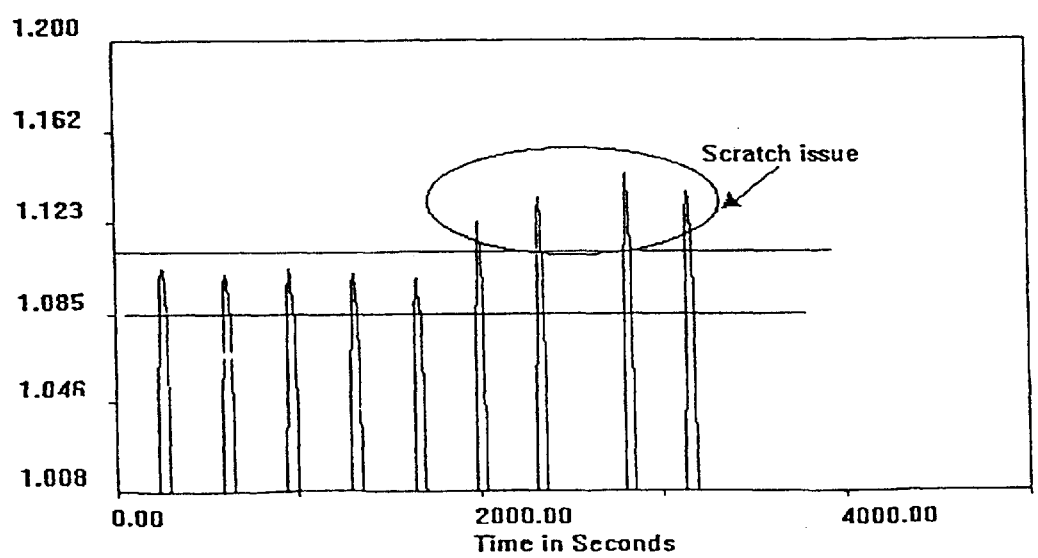
Figure 4C:
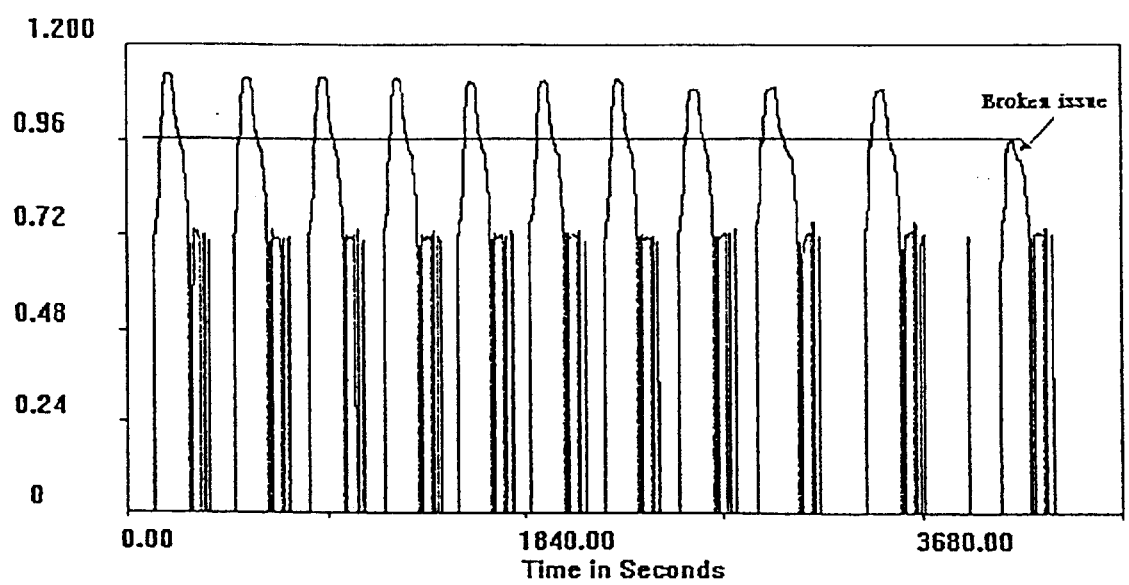

FIGS. 4A, 4B and 4C are graphs showing the waveforms of the phase current of a three-phase alternating induction motor measured by a current transformer under various polishing conditions. FIG. 4A shows the waveform of phase current measured by the current transformer 42 when the polishing table is operating normally. When the silicon chip on the polishing table is scratched, the waveform of phase current measured by the current transformer 42 has a larger fluctuation as shown in FIG. 4B. On the other hand, when a piece of the silicon chip on the polishing table is broken off, the waveform of phase current measured by the current transformer 42 has a smaller peak as shown in FIG. 4C.

Phase current $i_a$ of the three-phase alternating current induction motor 32 measured by the current transformer 42 is transformed into a current signal and sent to the I/O terminal of the relay controller 44. According to the size of current signal received at the I/O terminal, the relay controller 44 compares the current signal with data in an in-built database. When the received current signal shows a large variation indicating the scratching or chipping of silicon chip, the relay controller 44 will send out an I/O drive signal to the I/O terminal of the mechanical polishing controller 46. On receiving the I/O drive signal from the relay controller 44, the mechanical polishing controller 46 will issue a system halt signal to the control circuit 38. After receiving the system halt signal from the mechanical polishing controller 46, the control circuit 38 will inform the three-phase inverter 34 to switch off the three-phase alternating current so that the motor 32 stop rotating. In addition, an alarm will also be triggered somewhere near the polishing table to warn operating personnel to reset the polishing table.

In summary, this invention relies on sensing any anomalous current flowing to the motor due to an anomalous stress created by the scratching or chipping of a silicon chip. By monitoring the electrical current flowing to the motor and comparing with the data within an in-built database, any serious defects of silicon chip on the polishing table can be immediately found and rectified. Ultimately, overall number of silicon chips wasted will be greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A detecting device for monitoring any abnormality in a chemical-mechanical polishing operation, comprising:
   a motor for driving a chemical-mechanical polishing table;
   an inverter, connected to the motor, for converting a direct current to an alternating current and then using the alternating current for driving the motor;
   a control circuit, connected to the inverter, for controlling size and function of the alternating current output from the inverter;
   a sensor, inserted between the motor and the control circuit, for sensing the rotational speed of the motor, generating a rotation signal and sending the rotational signal to the control circuit; and
   a detector, connected to the control circuit, for measuring size of the alternating current flowing from the inverter to the motor and sending a system halt signal to the control circuit when appropriate conditions arise.

2. The detecting device of claim 1, wherein the motor includes a three-phase alternating current induction motor.

3. The detecting device of claim 1, wherein the inverter converts direct current from a power source into three-phase alternating current.

4. The detecting device of claim 1, wherein the sensor includes a transducer for converting rotational speed to a rotation signal.

5. The detecting device of claim 1, wherein the detector further includes a current sensor, a relay controller and a mechanical polishing controller.

6. A detecting device for monitoring any abnormality in a chemical-mechanical polishing operation, comprising:
   a motor for driving a chemical-mechanical polishing table;
   an inverter, connected to the motor, for converting a direct current to an alternating current and then using the alternating current for driving the motor;
   a control circuit, connected to the inverter, for controlling size and function of the alternating current output from the inverter;
   a rotational sensor, inserted between the motor and the control circuit, for converting the rotational speed of the motor into a rotation signal and sending the rotation signal to the control circuit;
   a current sensor for measuring size of the alternating current transmitted to the motor and outputting a corresponding current signal;
   a relay controller, connected to the current sensor, for receiving the current signal from the current sensor and outputting a drive signal; and
   a mechanical polishing controller, inserted between the relay controller and the control circuit, for receiving the drive signal from the relay controller and outputting a system halt signal to the control signal when appropriate conditions arise.

7. The detecting device of claim 6, wherein the motor is a three-phase alternating current induction motor.

8. The detecting device of claim 6, wherein the inverter converts direct current from a power source into three-phase alternating current.

9. The detecting device of claim 6, wherein the current sensor includes a current transformer.

* * * * *